(12) United States Patent
Chou et al.

(10) Patent No.: US 11,586,030 B1
(45) Date of Patent: Feb. 21, 2023

(54) ELECTRONIC DEVICE AND ELECTRONIC SYSTEM

(71) Applicant: ALTEK BIOTECHNOLOGY CORPORATION, Hsinchu (TW)

(72) Inventors: Chao-Yu Chou, Hsinchu (TW); Ting Cheng Ke, Hsinchu (TW)

(73) Assignee: ALTEK BIOTECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 17/520,613

(22) Filed: Nov. 5, 2021

(30) Foreign Application Priority Data

Aug. 13, 2021 (TW) ................................ 110209602

(51) Int. Cl.
G02B 23/24 (2006.01)
H05K 1/14 (2006.01)
H04N 5/225 (2006.01)
H04N 5/232 (2006.01)

(52) U.S. Cl.
CPC ....... G02B 23/2484 (2013.01); H04N 5/2253 (2013.01); H04N 5/2254 (2013.01); H04N 5/2256 (2013.01); H04N 5/23229 (2013.01); H05K 1/14 (2013.01); *H04N 2005/2255* (2013.01); *H05K 2201/10151* (2013.01)

(58) Field of Classification Search
CPC ............. G02B 23/2484; H04N 5/2253; H04N 5/2254; H04N 5/2256; H04N 5/23229; H04N 2005/2255; H05K 1/14; H05K 2201/10151
See application file for complete search history.

(56) References Cited

U.S. PATENT DOCUMENTS

| | | | | |
|---|---|---|---|---|
| 6,494,739 | B1 * | 12/2002 | Vivenzio | H01R 13/5804 358/473 |
| 2009/0021618 | A1 * | 1/2009 | Schwarz | A61B 1/051 348/294 |
| 2015/0208900 | A1 * | 7/2015 | Vidas | H04N 5/04 348/74 |
| 2017/0127921 | A1 * | 5/2017 | Motohara | H04N 5/2257 |
| 2017/0200870 | A1 * | 7/2017 | Chen | H01L 33/58 |
| 2019/0021582 | A1 * | 1/2019 | Shimizu | G02B 23/26 |
| 2020/0194951 | A1 * | 6/2020 | Loo | A61B 1/05 |
| 2020/0221598 | A1 * | 7/2020 | Loo | H05K 1/115 |
| 2021/0298953 | A1 * | 9/2021 | Govrin | A61B 1/0676 |

FOREIGN PATENT DOCUMENTS

JP           2006068057 A  *  3/2006

* cited by examiner

*Primary Examiner* — Jason A Flohre
(74) *Attorney, Agent, or Firm* — JCIPRNET

(57) ABSTRACT

An electronic device, including a first circuit board, a sensing element, a second circuit board, an electronic element, a light emitting element, and a lens, is provided. The first circuit board has a first surface and a second surface opposite to each other and a first side surface located therebetween. The sensing element is disposed on the first surface and electrically connected to the first circuit board. The second circuit board is located on the second surface and electrically connected to the first circuit board. The second circuit board has a third surface facing the first circuit board and a groove recessed in the third surface. The electronic element is disposed on the second surface and located in the groove. The light emitting element is disposed on the first side surface. The lens is disposed on the sensing element. An electronic system, including the electronic device, is also provided.

16 Claims, 17 Drawing Sheets

ELECTRONIC DEVICE AND ELECTRONIC SYSTEM

CROSS-REFERENCE TO RELATED APPLICATION

This application claims the priority benefit of Taiwan application serial no. 110209602, filed on Aug. 13, 2021. The entirety of the patent application is hereby incorporated by reference herein and made a part of this specification.

BACKGROUND

Technical Field

The disclosure relates to an electronic device and an electronic system, and particularly relates to a micro electronic device and an electronic system for an endoscope.

Description of Related Art

The endoscope is an electronic device that can enter a narrow pipe for sensing. In order for the endoscope to smoothly enter the narrow pipe, the diameter of the endoscope must be miniaturized. In addition, a region in the endoscope where parts such as the lens and circuit components are disposed cannot be bent. In order for the endoscope to flexibly move in the narrow pipe, the region that cannot be bent should be as short as possible.

Since the endoscope has a specific number of parts such as the circuit components, a circuit board with a specific area is required to carry the parts and the relevant circuit layout. The current endoscope configures the parts on a flexible circuit board. Through the bendable characteristic of the flexible circuit board, the flexible circuit board may be bent and fitted into a casing with a very small inside diameter.

However, the bending of the flexible circuit board requires space, and a supporting holder is also required for assistance and the supporting holder also occupies additional space, such that it is difficult to reduce the region in the endoscope that cannot be bent.

SUMMARY

The disclosure provides an electronic device that has a relatively small overall thickness due to a special configuration of a circuit board and parts thereof.

The disclosure provides an electronic system whose electronic device has a relatively small overall thickness due to a special configuration of a circuit board and parts thereof.

The electronic device of the disclosure includes a first circuit board, a sensing element, a second circuit board, an electronic element, a light emitting element, and a lens. The first circuit board has a first surface and a second surface opposite to each other and a first side surface located between the first surface and the second surface. The sensing element is disposed on the first surface of the first circuit board and is electrically connected to the first circuit board. The second circuit board is located on the second surface of the first circuit board and is electrically connected to the first circuit board. The second circuit board has a third surface facing the first circuit board and a groove recessed in the third surface. The electronic element is disposed on the second surface of the first circuit board and is located in the groove. The light emitting element is disposed at least on the first side surface of the first circuit board. The lens is disposed on the sensing element.

The electronic system of the disclosure includes an electronic device and a processor. The electronic device includes a first circuit board, a sensing element, a second circuit board, an electronic element, a light emitting element, and a lens. The first circuit board has a first surface and a second surface opposite to each other and a first side surface located between the first surface and the second surface. The sensing element is disposed on the first surface of the first circuit board and is electrically connected to the first circuit board. The second circuit board is located on the second surface of the first circuit board and is electrically connected to the first circuit board. The second circuit board has a third surface facing the first circuit board and a groove recessed in the third surface. The electronic element is disposed on the second surface of the first circuit board and is located in the groove. The light emitting element is disposed at least on the first side surface of the first circuit board. The lens is disposed on the sensing element. The processor is electrically connected to the electronic device. The sensing element receives an image transmitted by the lens, and the processor processes the image received by the sensing element.

In an embodiment of the disclosure, the first circuit board has a first long side, the electronic element has a second long side, the first long side is parallel to the second long side, and the groove extends along an extending direction of the first long side.

In an embodiment of the disclosure, the first circuit board has a first long side, the electronic element has a second long side, the first long side is perpendicular to the second long side, and the groove extends along an extending direction of the second long side.

In an embodiment of the disclosure, each of the light emitting element has two pads, and the two pads are connected to the first side surface of the first circuit board.

In an embodiment of the disclosure, each of the light emitting element has two pads, one of the two pads is connected to the first side surface of the first circuit board, and other one is connected to a second side surface of the second circuit board.

In an embodiment of the disclosure, the electronic device further includes multiple transmission lines, the second circuit board has a fourth surface opposite to the third surface and multiple blind holes recessed in the fourth surface, and the transmission lines are respectively inserted into the blind holes to be electrically connected to the second circuit board.

In an embodiment of the disclosure, the electronic device further includes a coaxial transmission line, the first circuit board has a third side surface adjacent to the first side surface and a first groove hole recessed in the third side surface, the second circuit board has a fourth side surface adjacent to the second side surface and a second groove hole recessed in the fourth side surface, the second groove hole corresponds to the first groove hole, the coaxial transmission line is located in the first groove hole and the second groove hole, an outer layer route of the coaxial transmission line is connected to the second circuit board, and an inner layer route of the coaxial transmission line is connected to the first circuit board.

In an embodiment of the disclosure, the second circuit board has a fourth surface opposite to the third surface and a blind hole recessed in the fourth surface, and the electronic device further includes a transmission line inserted into the blind hole to be electrically connected to the second circuit board.

In an embodiment of the disclosure, the electronic device further includes a coaxial transmission line, the second circuit board has a fourth side surface adjacent to the second side surface and a second groove hole recessed in the fourth side surface, the coaxial transmission line is located in the second groove hole, an outer layer route of the coaxial transmission line is connected to the second circuit board, and an inner layer route of the coaxial transmission line is connected to the second surface of the first circuit board.

In an embodiment of the disclosure, the second circuit board has a fourth surface opposite to the third surface and a blind hole recessed in the fourth surface, and the electronic device further includes a transmission line inserted into the blind hole to be electrically connected to the second circuit board.

In an embodiment of the disclosure, the electronic system further includes a display. The display is electrically connected to the processor and displays the image processed by the processor.

Based on the above, in the electronic device of the disclosure, the sensing element is disposed on the first surface of the first circuit board, and the second circuit board is located on the second surface of the first circuit board. With the laminated structure of the circuit board, the circuit board does not need to be bent. Therefore, the electronic device of the disclosure can prevent the case where when the conventional flexible circuit board is adopted, the flexible circuit board is bent and needs to be supported by the supporting holder, which occupies a larger space. Therefore, the circuit components of the electronic device of the disclosure may occupy a smaller space. In addition, the electronic element is disposed on the second surface of the first circuit board and is located in the groove of the second circuit board. The second circuit board can accommodate the electronic element by the groove to be connected to the first circuit board, so the thickness of the laminated structure of the two circuit boards can be effectively reduced. In addition, the light emitting element is disposed at least on the first side surface of the first circuit board. In this way, the space of the side surface of the circuit board can be effectively used to prevent the light emitting element from additionally occupying the space above and below the circuit board to reduce the area of the circuit board, thereby reducing the size of the electronic device.

DETAILED DESCRIPTION OF DISCLOSED EMBODIMENTS

Figure 1:
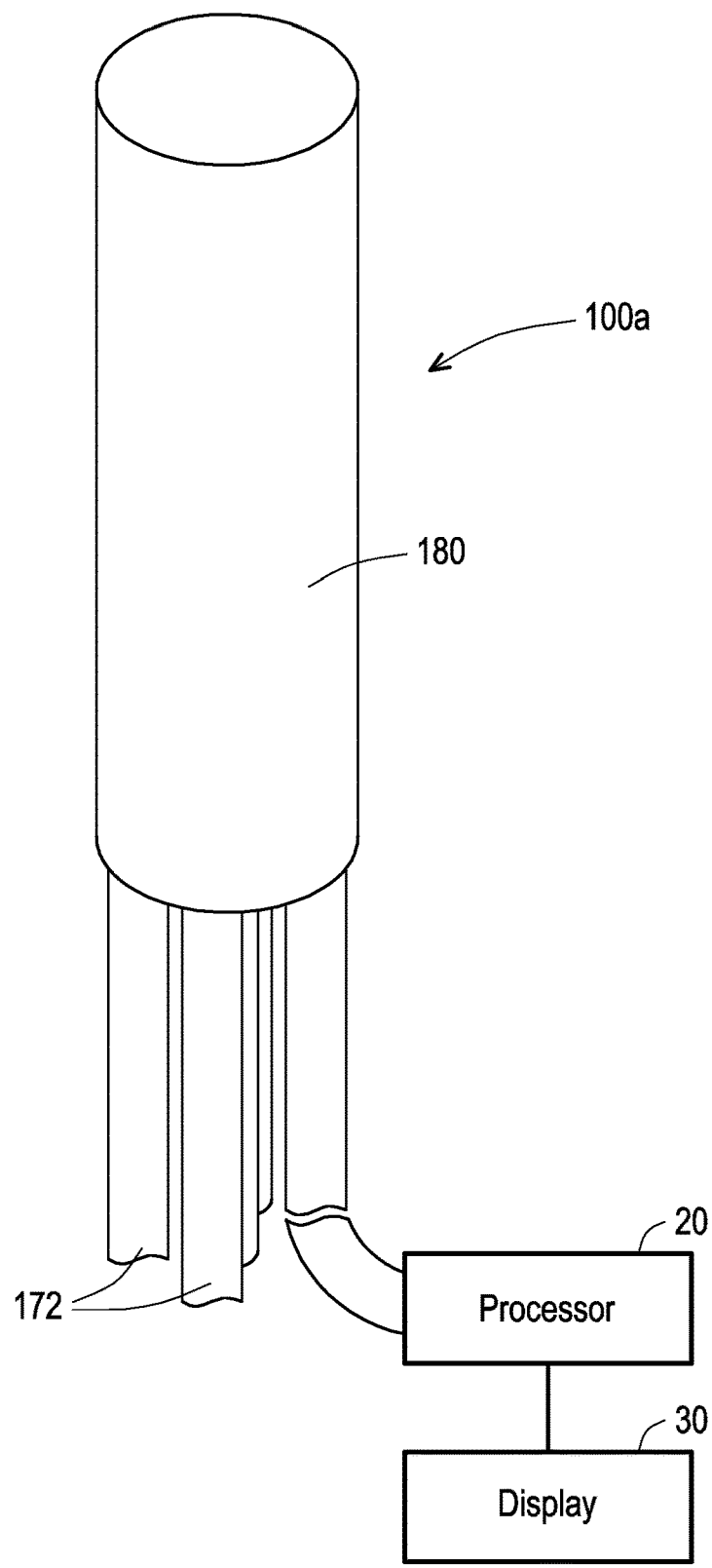
FIG. 1 is a schematic view of an electronic system according to an embodiment of the disclosure.
Figure 2:
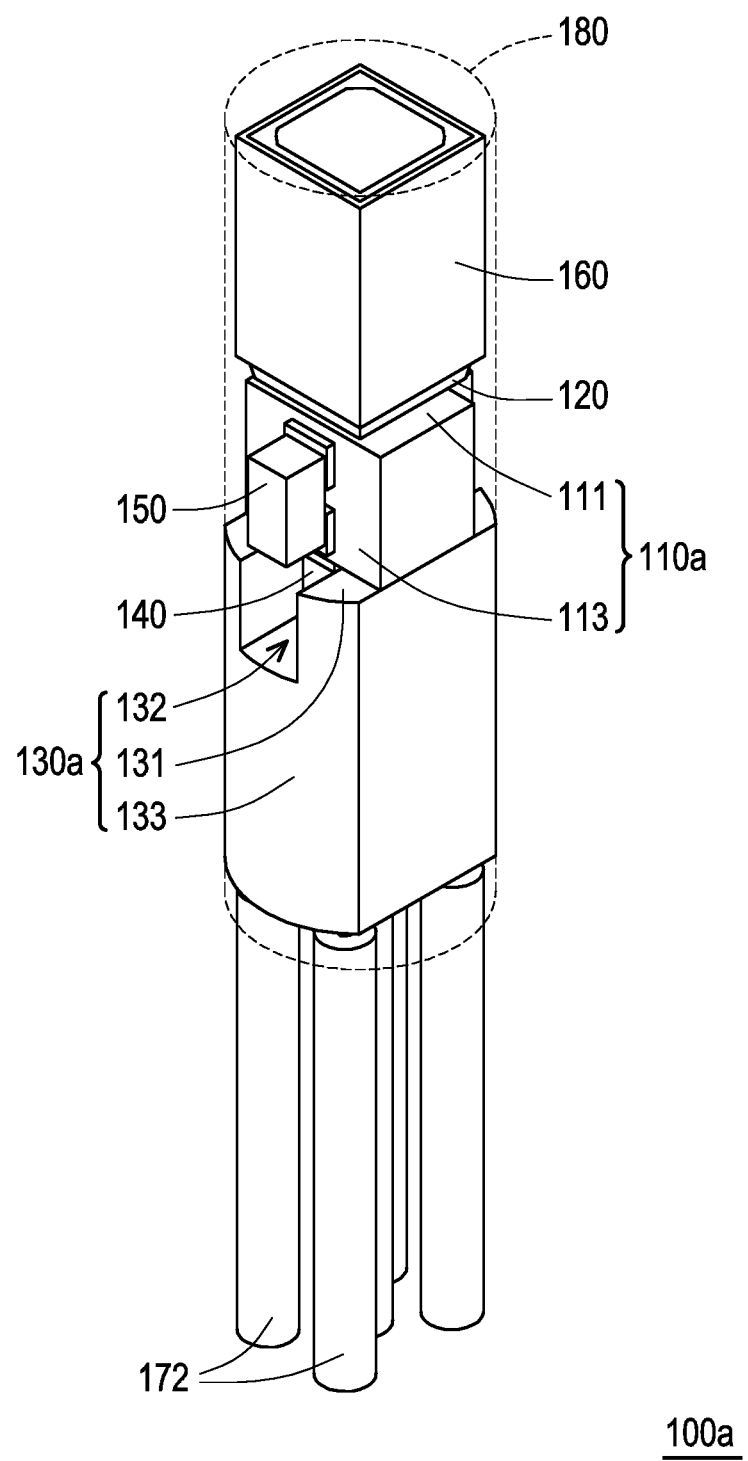
FIG. 2 is a partial perspective three-dimensional view of an electronic device of FIG. 1.

FIG. 1 is a schematic view of an electronic system according to an embodiment of the disclosure. FIG. 2 is a partial perspective three-dimensional view of an electronic device of FIG. 1. Please refer to FIG. 1 and FIG. 2. An electronic system 10 of the embodiment includes an electronic device 100a, a processor 20, and a display 30. The electronic system 10 is, for example, an endoscope system, and the electronic device 100a is, for example, an endoscope, which may be applied in medicine or industry.

The endoscope can enter a human body or a mechanism to be detected via various narrow pipes. A sensing element 120 can receive an image transmitted by a lens 160 and transmit a signal to the processor 20 by a transmission line 172. The processor 20 processes the image received by the sensing element 120. The display 30 displays the image processed by the processor 20. Therefore, the user can see the image of the human body or the mechanism to be detected by the display 30. Of course, the type of the electronic system 10 of the embodiment is not limited thereto.

Figure 3:
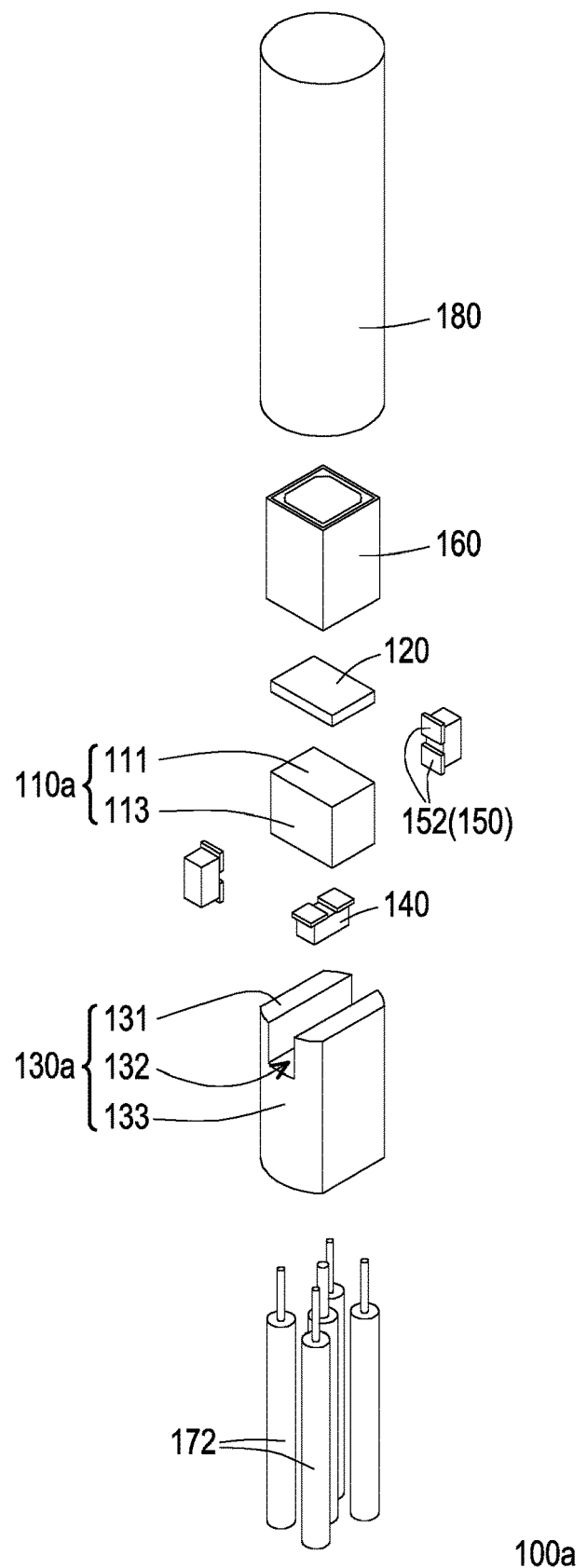
FIG. 3 is an exploded three-dimensional view of FIG. 1.
Figure 4:
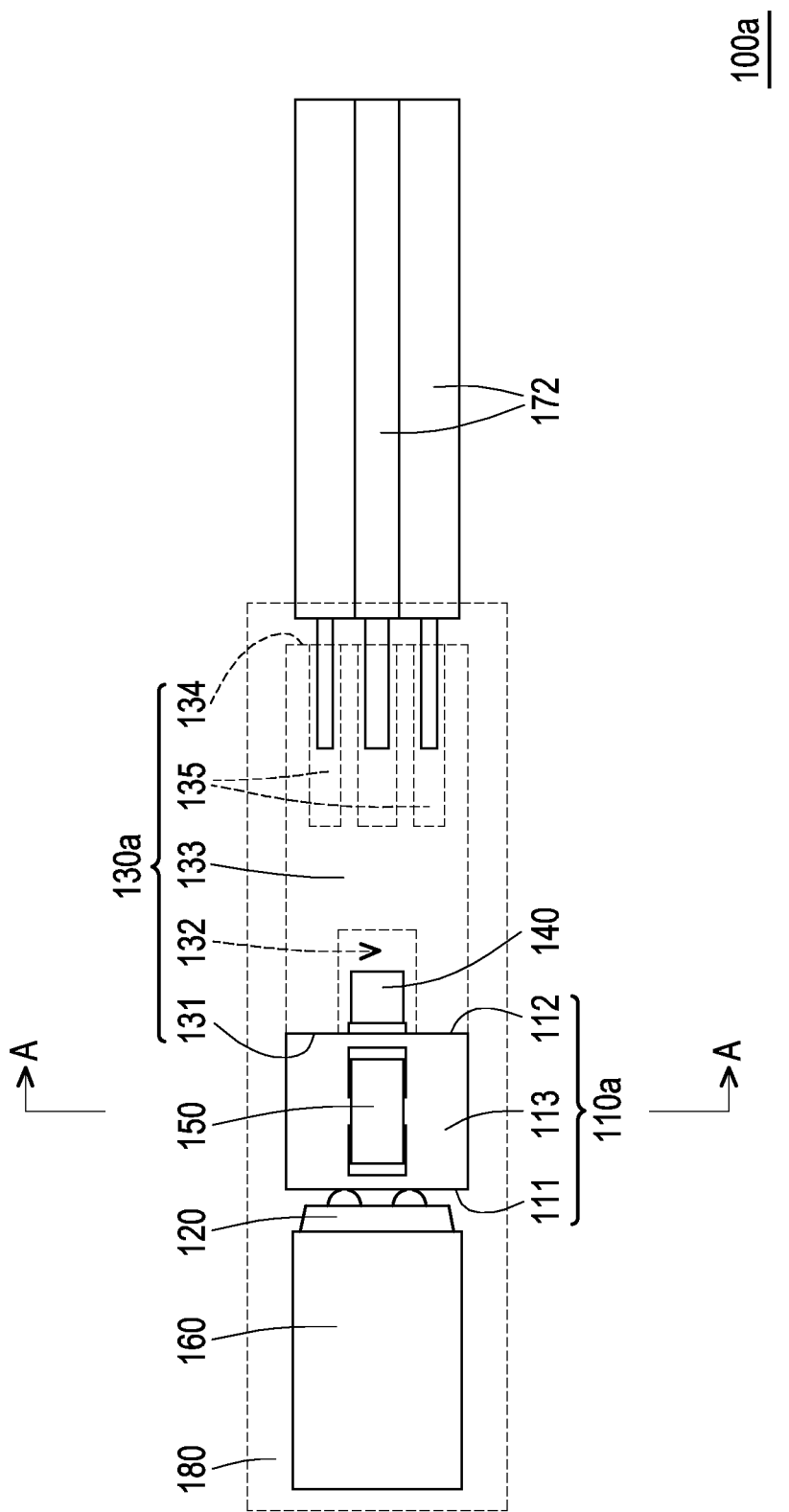
FIG. 4 is a partial perspective side view of FIG. 1.

FIG. 3 is an exploded three-dimensional view of FIG. 1. FIG. 4 is a partial perspective side view of FIG. 1. Please refer to FIG. 2 to FIG. 4. In the embodiment, the electronic device 100a includes a first circuit board 110a, the sensing element 120, a second circuit board 130a, an electronic element 140, a light emitting element 150, the lens 160, and a casing 180. The casing 180 is hard and surrounds the first circuit board 110a, the sensing element 120, the second circuit board 130a, the electronic element 140, the light emitting element 150, and the lens 160 to define a non-bendable region of the electronic device 100a.

In the embodiment, the first circuit board 110a and the second circuit board 130a are hard boards. Therefore, the first circuit board 110a and the second circuit board 130a may be stably disposed in the casing 180 without the assistance of any additional supporting holder to prevent the supporting holder from occupying the space in the casing 180.

Specifically, the first circuit board 110a has a first surface 111 and a second surface 112 (FIG. 4) opposite to each other and a first side surface 113 located between the first surface 111 and the second surface 112. The sensing element 120 is disposed on the first surface 111 of the first circuit board 110a and is electrically connected to the first circuit board 110a. The lens 160 is disposed on the sensing element 120. The second circuit board 130a is located on the second surface 112 of the first circuit board 110a and is electrically connected to the first circuit board 110a.

Compared with the conventional use of the flexible circuit board to configure elements, due to the large number of elements and the small inside diameter of the casing, the flexible circuit board needs to be bent to be fitted into the casing, and a supporting holder is required to support the flexible circuit board, which occupies a lot of space in the casing. The electronic device 100a of the embodiment configures the required elements by the hard first circuit board 110a and second circuit board 130a, which can prevent the conventional bending of the circuit board and the space occupied by the supporting holder.

As shown in FIG. 2 to FIG. 4, the second circuit board 130a has a third surface 131 facing the first circuit board 110a and a groove 132 recessed in the third surface 131. The electronic element 140 is, for example, a capacitor, but the type of the electronic element 140 is not limited thereto. The electronic element 140 is disposed on the second surface 112 of the first circuit board 110a and is located in the groove 132. As such, the second circuit board 130a can accommodate the electronic element 140 by the groove 132 and be well bonded to the first circuit board 110a for electrical connection, and the thickness of the laminated structure of the first circuit board 110a and the second circuit board 130a can be effectively reduced.

As shown in FIG. 4, a portion of the second circuit board in the groove 132 130a cannot be connected to the first circuit board 110a due to being recessed in the third surface 131. Therefore, the smaller the overlapping region between the first circuit board 110a and the groove 132, the larger the region where the first circuit board 110a and the second circuit board 130a can be electrically connected.

Figure 5A:
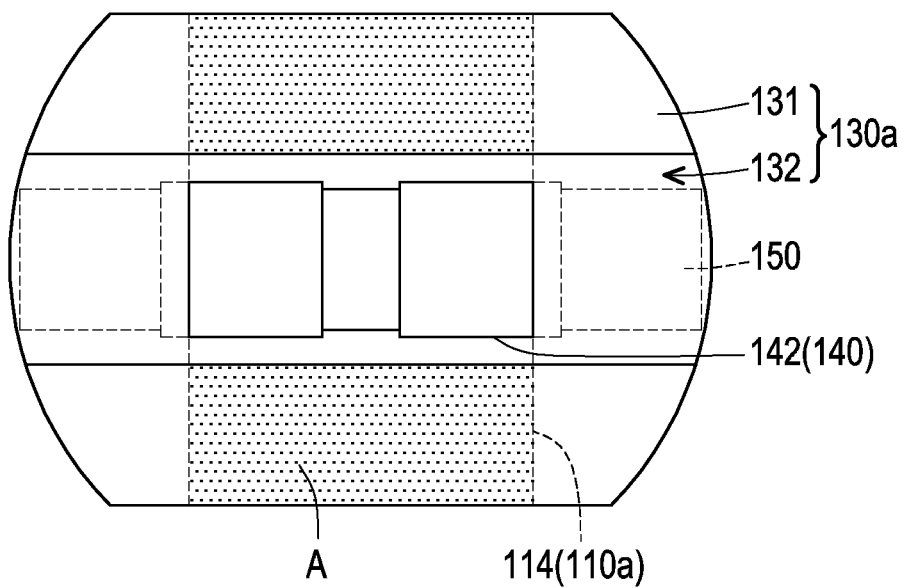
FIG. 5A is a partial perspective cross-sectional schematic view along a line A-A of FIG. 4.
Figure 5B:
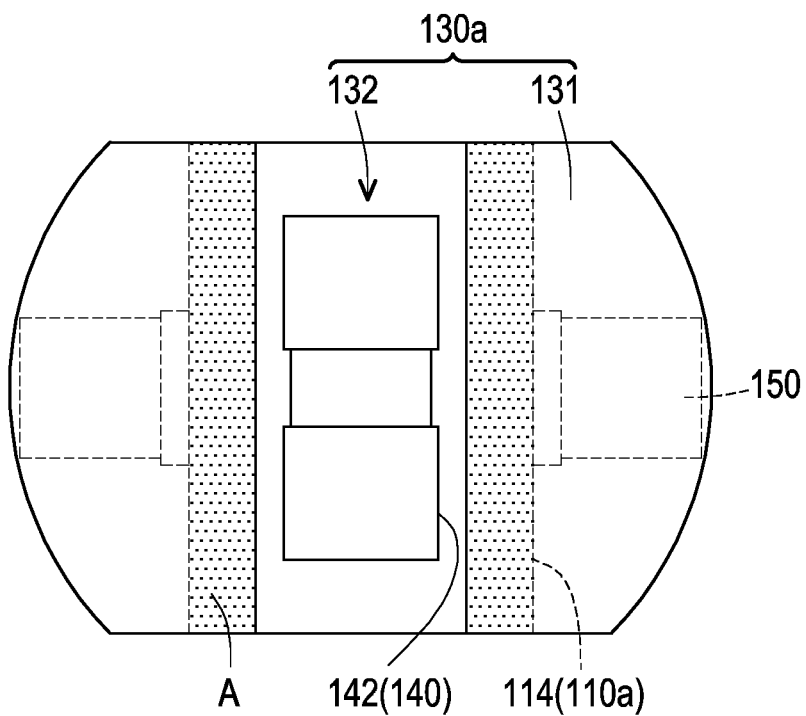
FIG. 5B is a schematic view according to another embodiment of FIG. 5A.

FIG. 5A is a partial perspective cross-sectional schematic view along a line A-A of FIG. 4. FIG. 5B is a schematic view according to another embodiment of FIG. 5A. It should be noted that in FIG. 5A and FIG. 5B, the boundary of the first circuit board 110a is represented by dashed lines, and the region where the first circuit board 110a and the second circuit board 130a can be electrically connected is the dotted portions in the drawings.

As shown in FIG. 5A, in the embodiment, the first circuit board 110a has a first long side 114, and the electronic element 140 has a second long side 142. In FIG. 5A, the electronic element 140 is horizontally placed on the center of the first circuit board 110a. Specifically, the first long side 114 of the first circuit board 110a extends toward a top-down direction, and the second long side 142 of the electronic element 140 extends toward a left-right direction, so that the first long side 114 is perpendicular to the second long side 142. In addition, the first long side 114 of the first circuit board 110a is perpendicular to an extending direction of the groove 132 of the second circuit board 130a.

In the embodiment, the electronic element 140 extends into the groove 132 of the second circuit board 130a, and the groove 132 extends along an extending direction of the second long side 142 of the electronic element 140. In order to increase the area of the second circuit board 130a, the width of the groove 132 should be as small as possible, and preferably only slightly larger than the width of the electronic element 140.

As shown in FIG. 5A, in the case where the extending direction of the groove 132 is perpendicular to the first long side 114 of the first circuit board 110a, a region where the groove 132 crosses over the first circuit board 110a is relatively small. Therefore, the overlapping region between the first circuit board 110a and the groove 132 is smaller, and a connecting region A between the first circuit board 110a and the second circuit board 130a is larger. Therefore, there is a larger space between the first circuit board 110a and the second circuit board 130a to configure more contacts for electrical connection.

The disclosure is not limited to the above. As shown in FIG. 5B, in other embodiments, the first long side 114 may also be parallel to the second long side 142, and the groove 132 extends along an extending direction of the first long side 114. In addition, in other embodiments, an included angle between the first long side 114 and the second long side 142 may be any angle, which is not limited thereto.

Similarly, the first circuit board 110a and the second circuit board 130a may also be well bonded.

In addition, the light emitting element 150 is, for example, a light emitting diode (LED), and the light emitting element 150 can provide illumination, so that the electronic device 100a can also perform good sensing when entering a dark place without illumination. As shown in FIG. 3, in the embodiment, the number of light emitting elements 150 is two, which are respectively disposed on two opposite sides of the first circuit board 110a.

In the embodiment, each light emitting element 150 has two pads 152. The two pads 152 are connected to the first side surface 113 of the first circuit board 110a. In this way, the light emitting element 150 may be combined with the first circuit board 110a at the time of manufacture. Therefore, the alignment of the pads 152 is not required during assembly, thereby improving the convenience of assembly.

However, the disclosure is not limited to the above. In other embodiments, one of the two pads 152 is connected to the first side surface 113 of the first circuit board 110a, and the other one is connected to a second side surface 133 (FIG. 7C to FIG. 7E) of the second circuit board 130a. Since the first circuit board 110a does not need to match the thickness of the light emitting element 150 in order to connect the two pads 152 at the same time, the first circuit board 110a may have a smaller thickness, so that the overall thickness of the electronic device 100a may be reduced.

As shown in FIG. 4, in the embodiment, the electronic device 100a further includes multiple transmission lines 172. The second circuit board 130a has a fourth surface 134 opposite to the third surface 131 and multiple blind holes 135 recessed in the fourth surface 134. The blind holes 135 are recessed in the fourth surface 134 of the second circuit board 130a but do not penetrate the second circuit board 130a, and the blind holes 135 are connected to a circuit layer inside the second circuit board 130a. After the transmission lines 172 are respectively inserted into the blind holes 135, the transmission lines 172 can be electrically connected to the circuit layer inside the second circuit board 130a.

Figure 6A:
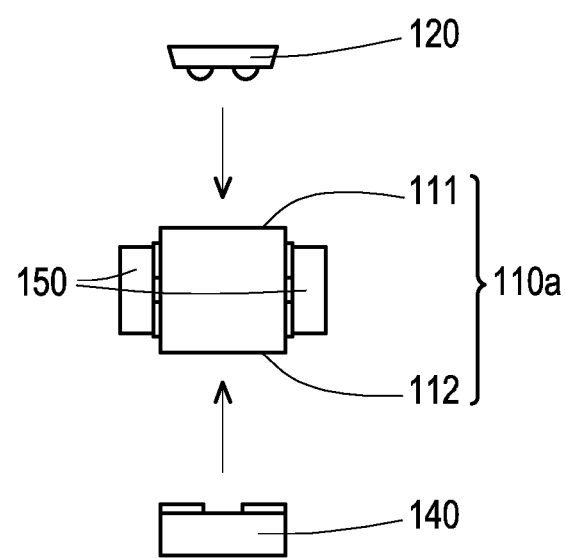
FIG. 6A to FIG. 6D are schematic views of an assembly process of FIG. 1.

FIG. 6A to FIG. 6D are schematic views of an assembly process of FIG. 1. Please refer to FIG. 6A to FIG. 6D. In the embodiment, an assembly method of the electronic device 100a is as follows. Firstly, as shown in FIG. 6A, the two light emitting elements 150 are respectively disposed on the two corresponding sides of the first circuit board 110a, and the sensing element 120 and the electronic element 140 are respectively disposed on the first surface 111 and the second surface 112 of the first circuit board 110a.

Figure 6B:
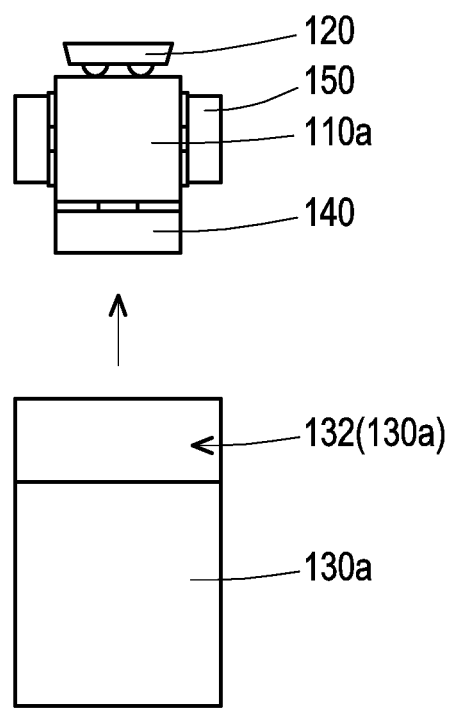
Figure 6C:
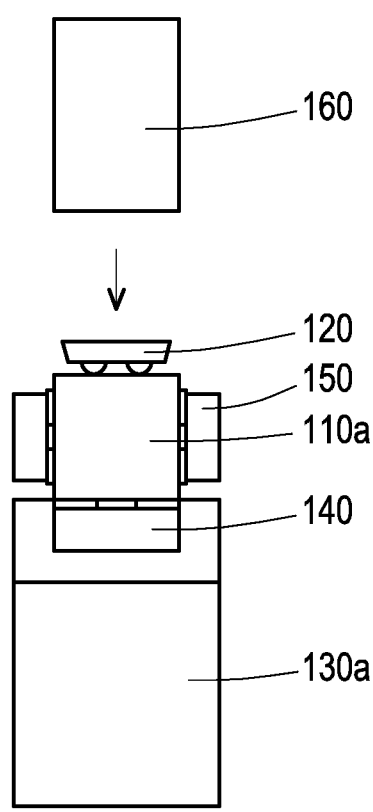
Figure 6D:
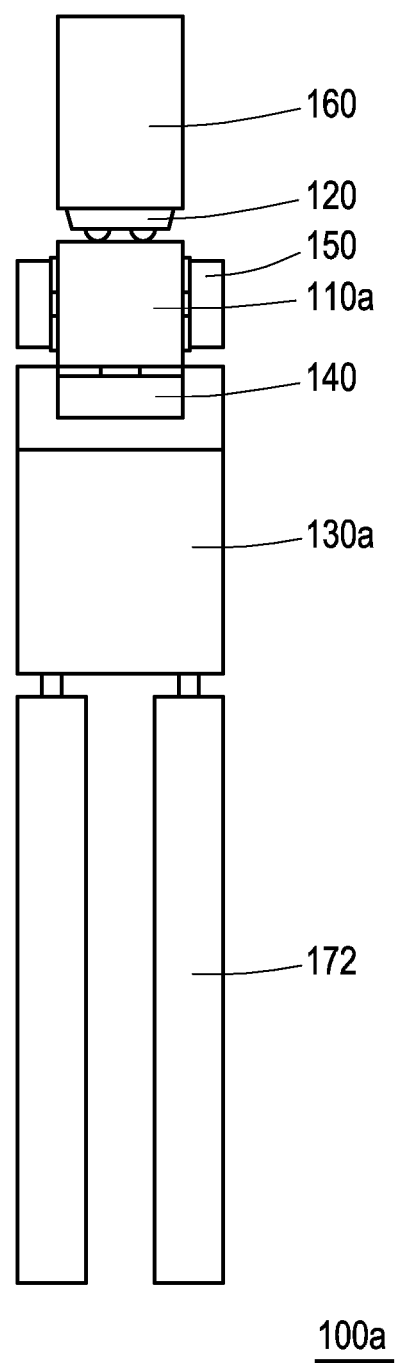

As shown in FIG. 6B, the second circuit board 130a is disposed on the second surface 112 of the first circuit board 110a, and the electronic element 140 is located in the groove 132. As shown in FIG. 6C, the lens 160 is disposed on the sensing element 120. Finally, as shown in FIG. 6D, the transmission lines 172 are inserted into the blind holes 135 of the second circuit board 130a to be electrically connected to the second circuit board 130a.

Figure 7A:
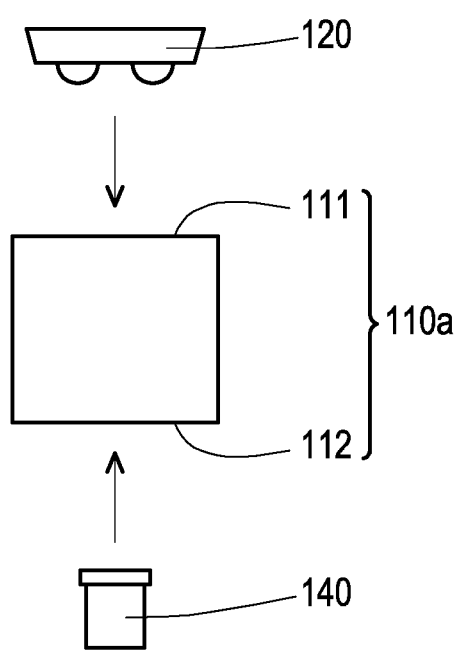
FIG. 7A to FIG. 7E are schematic views of an assembly process according to another embodiment of the disclosure.

FIG. 7A to FIG. 7E are schematic views of an assembly process according to another embodiment of the disclosure. Please refer to FIG. 6A to FIG. 6D and FIG. 7A to FIG. 7E at the same time. The difference between the assembly method of the present embodiment and the assembly method of FIG. 6A to FIG. 6D is that the installation sequence of the light emitting element 150 is different. Please refer to FIG. 7A to FIG. 7E. In the embodiment, an assembly method of an electronic device 100' is as follows. Firstly, as shown in FIG. 7A, the sensing element 120 and the electronic element 140 are respectively disposed on the first surface 111 and the second surface 112 of the first circuit board 110a.

Figure 7B:
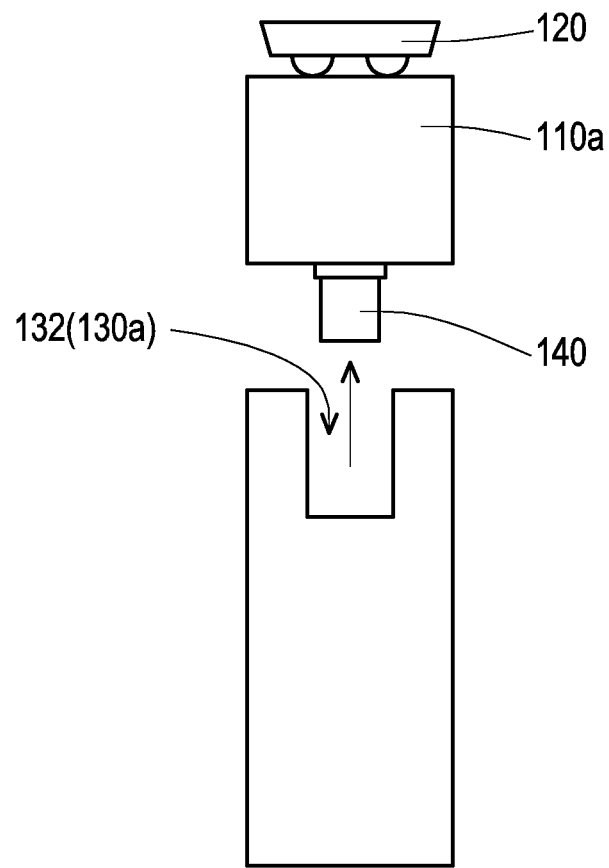
Figure 7C:
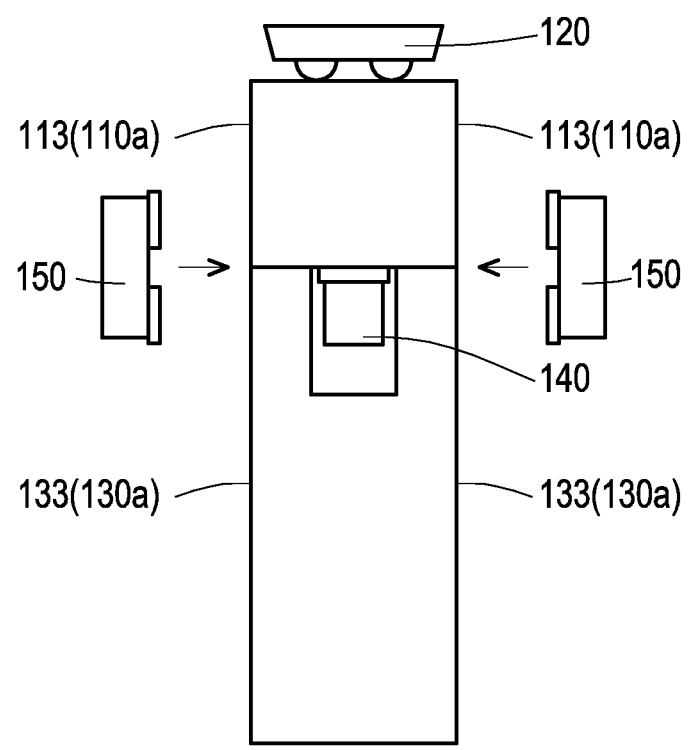
Figure 7D:
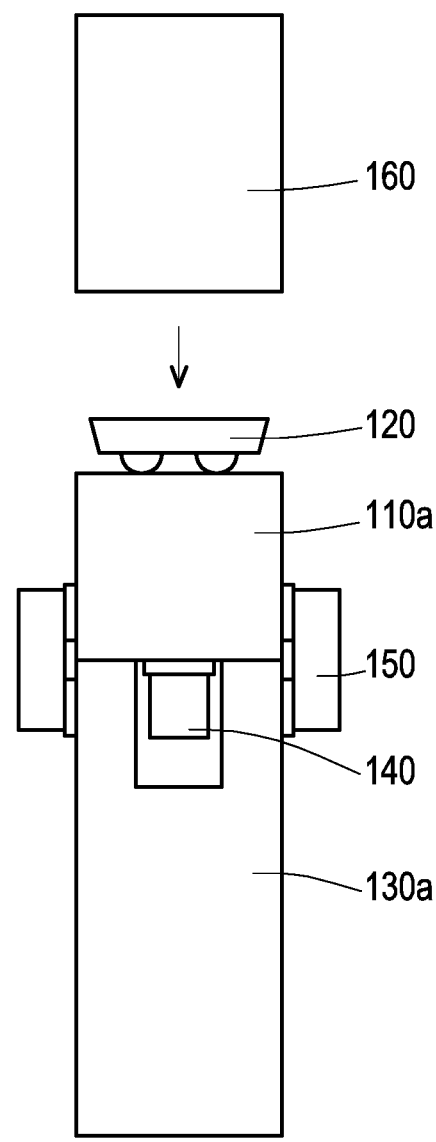
Figure 7E:
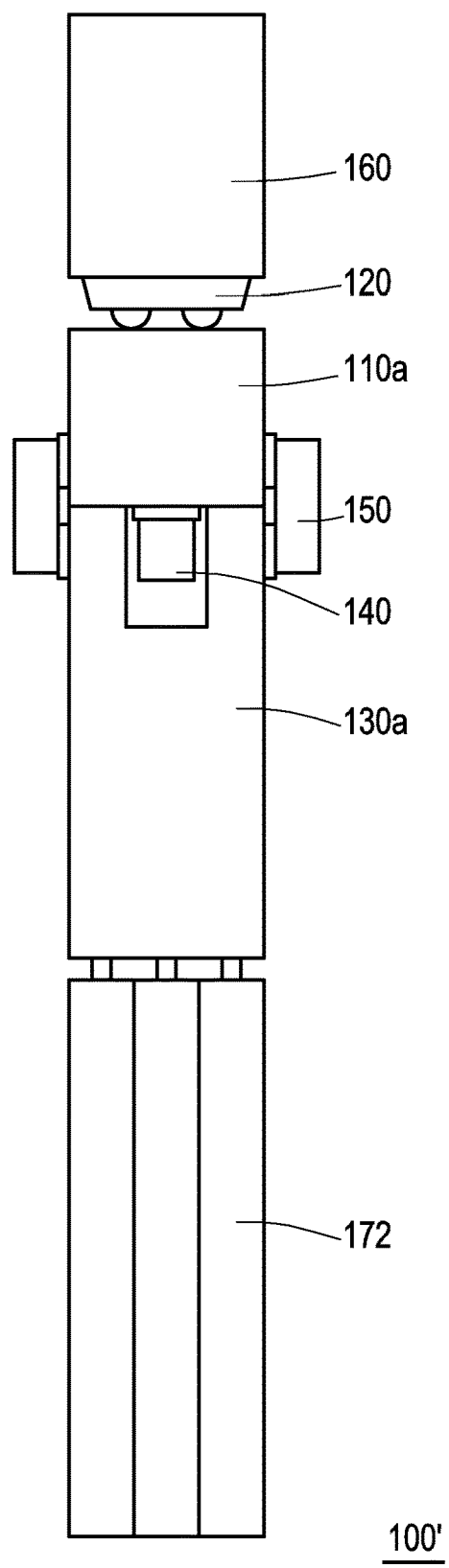

As shown in FIG. 7B, the second circuit board 130a is disposed on the second surface 112 of the first circuit board 110a, and the electronic element 140 is located in the groove 132. As shown in FIG. 7C, one of the two pads 152 is connected to the first side surface 113 of the first circuit board 110a, and the other one is connected to the second side surface 133 of the second circuit board 130a, so that the light emitting element 150 is straddled between the first circuit board 110a and the second circuit board 130a. As shown in FIG. 7D, the lens 160 is disposed on the sensing element 120. Finally, as shown in FIG. 7E, the transmission lines 172 are inserted into the blind holes 135 of the second circuit board 130a to be electrically connected to the second circuit board 130a.

It must be noted here that the following embodiments continue to use the reference numerals and some content of the foregoing embodiments, wherein the same reference numerals are adopted to represent the same or similar elements, and the description of the same technical content is omitted. For the description of the omitted parts, reference may be made to the foregoing embodiments, which will not be repeated in the following embodiments.

Figure 8:
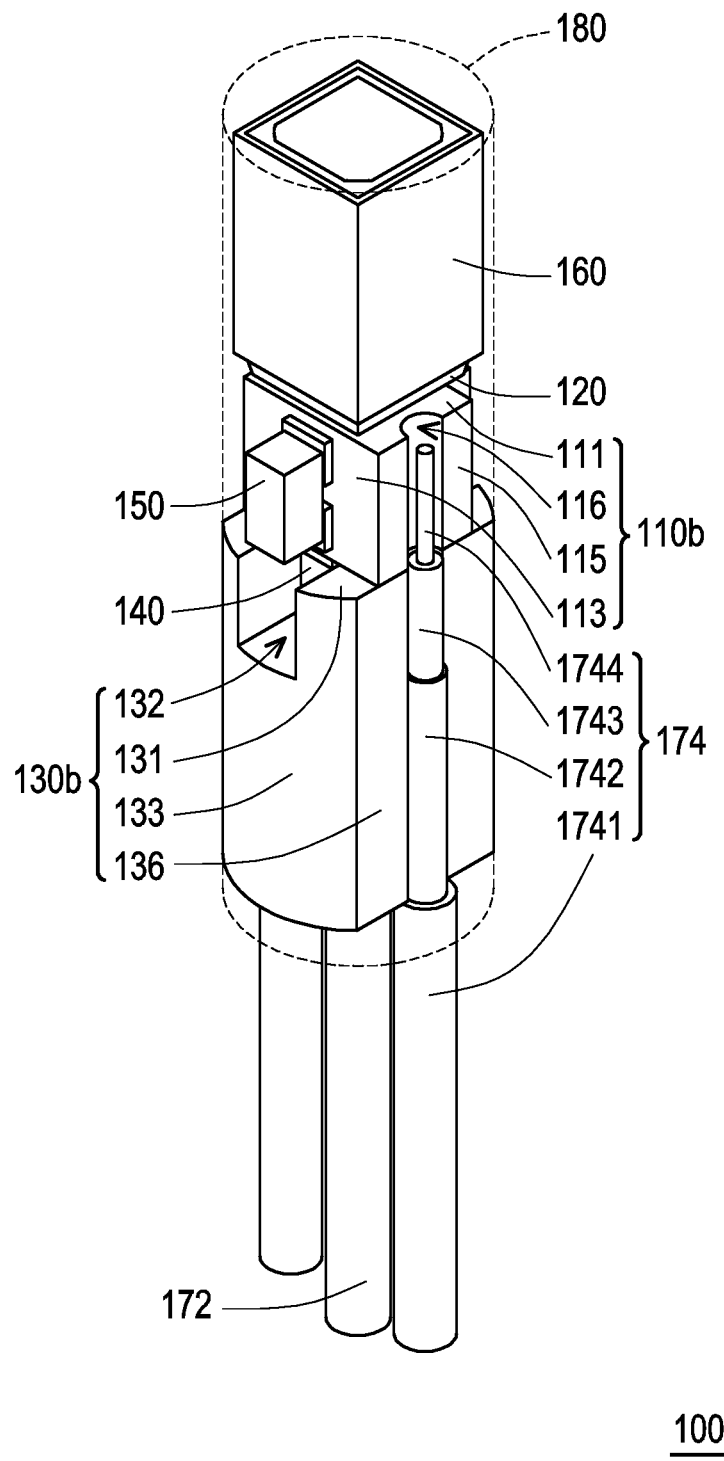
FIG. 8 is a partial perspective three-dimensional view of an electronic device according to another embodiment of the disclosure.
Figure 9:
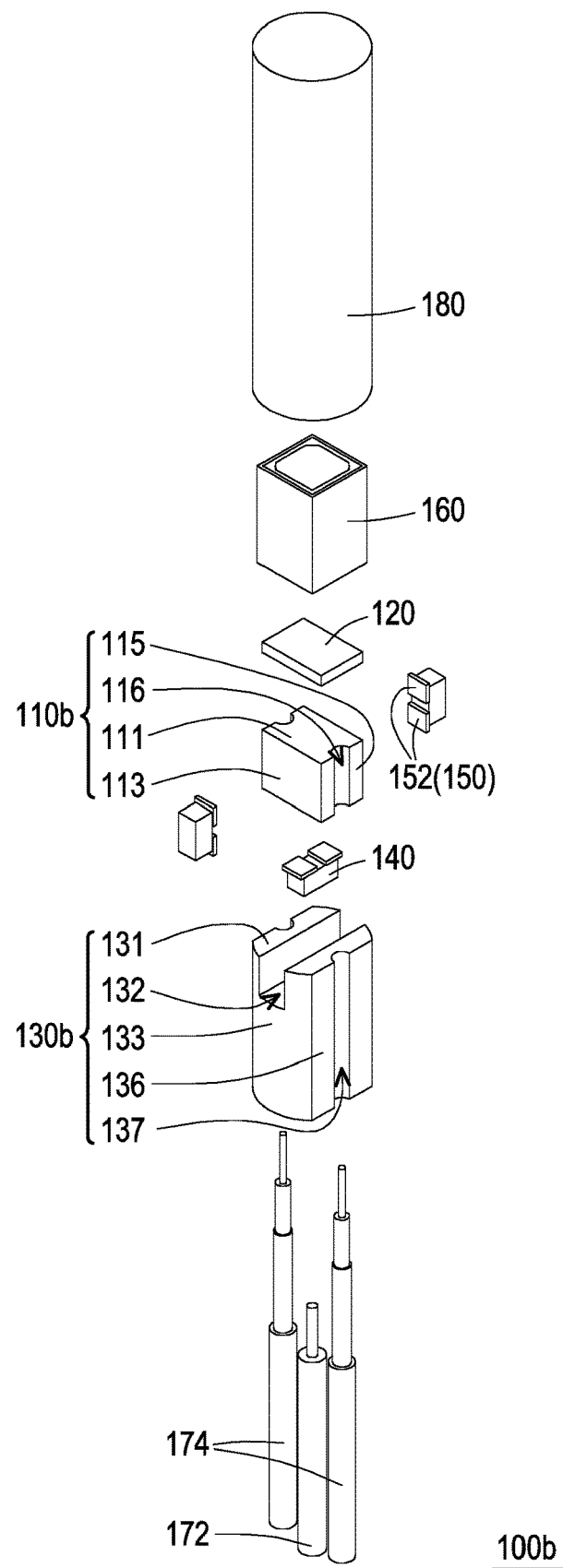
FIG. 9 is an exploded three-dimensional view of FIG. 8.

FIG. 8 is a partial perspective three-dimensional view of an electronic device according to another embodiment of the disclosure. FIG. 9 is an exploded three-dimensional view of FIG. 8. Please refer to FIG. 2, FIG. 3, FIG. 8, and FIG. 9 at the same time. An electronic device 100b of the embodiment is similar to the electronic device 100a of FIG. 2 and FIG. 3. The difference between the two is that in the present embodiment, the electronic device 100b further includes a coaxial transmission line 174. The coaxial transmission line 174 has an outer layer route 1742 and an inner layer route 1744. The outer layer route 1742 and the inner layer route 1744 are separated by an insulating layer 1743. The outer layer route 1742 is coated with an insulating layer 1741 as an outer skin.

A first circuit board 110b has a third side surface 115 adjacent to the first side surface 113 and a first groove hole 116 recessed in the third side surface 115. A second circuit board 130b has a fourth side surface 136 adjacent to the second side surface 133 and a second groove hole 137 recessed in the fourth side surface 136. The second groove hole 137 corresponds to the first groove hole 116. The coaxial transmission line 174 is located in the first groove hole 116 and the second groove hole 137. The outer layer route 1742 of the coaxial transmission line 174 is connected to the second circuit board 130b. The inner layer route 1744 of the coaxial transmission line 174 is connected to the first circuit board 110b.

In the embodiment, the first groove hole 116 and the second groove hole 137 are respectively laid with routes to be electrically connected to circuit layers of the first circuit board 110b and the second circuit board 130b. The outer layer route 1742 of the coaxial transmission line 174 can transmit a signal to the second circuit board 130b through the second groove hole 137, and then transmit the signal to the first circuit board 110b through contacts between the first circuit board 110b and the second circuit board 130b.

In addition, the inner layer route 1744 of the coaxial transmission line 174 can directly transmit the signal to the first circuit board 110b through the first groove hole 116. Therefore, the demand for signal transmission between the first circuit board 110b and the second circuit board 130b is reduced, thereby reducing the number of contacts between the first circuit board 110b and the second circuit board 130b, and reducing the requirement for alignment accuracy.

In addition, in the embodiment, the fourth surface 134 of the second circuit board 130b may also be provided with a blind hole 135. The electronic device 100b further includes a transmission line 172. The transmission line 172 is inserted into the blind hole 135 to be electrically connected to the second circuit board 130b. In the embodiment, since some signals may be transmitted via the inner layer route 1744 and the outer layer route 1742 of the coaxial transmission line 174, the signal transmission effect of one coaxial transmission line 174 may be equivalent to the signal transmission effect of two transmission lines 172. Therefore, compared with the electronic device 100a, the electronic device 100b of the present embodiment may reduce the number of configured transmission lines 172.

Figure 10:
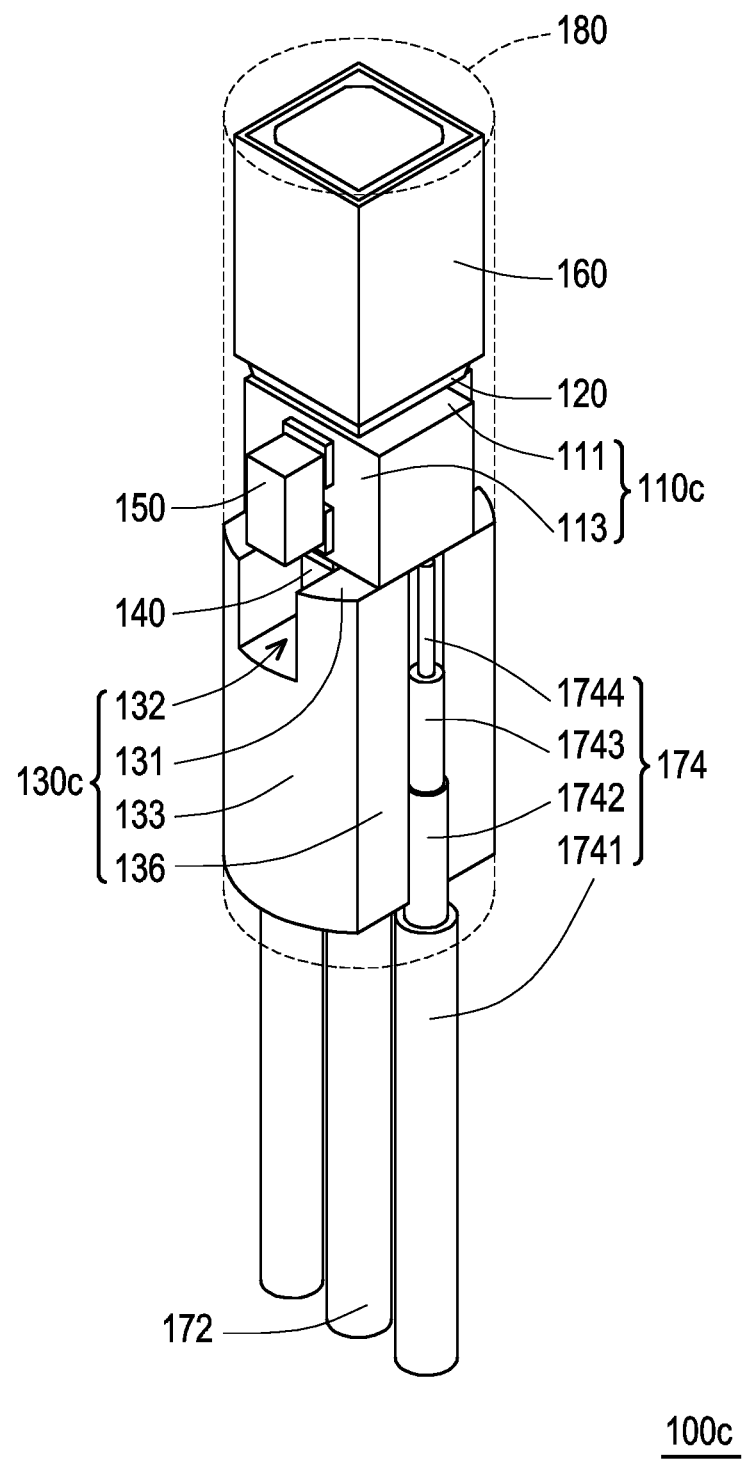
FIG. 10 is a partial perspective three-dimensional view of an electronic device according to another embodiment of the disclosure.

FIG. 10 is a partial perspective three-dimensional view of an electronic device according to another embodiment of the disclosure. Please refer to FIG. 8 and FIG. 10 at the same time. An electronic device 100c of the embodiment is similar to the electronic device 100b of FIG. 8. The difference between the two is that the electronic device 100c does not have the first groove hole 116. The coaxial transmission line 174 is located in the second groove hole 137. The outer layer route 1742 of the coaxial transmission line 174 is connected to a second circuit board 130c. A top end of the inner layer route 1744 of the coaxial transmission line 174 is connected to the second surface 112 of a first circuit board 110c.

In the embodiment, the inner layer route 1744 of the coaxial transmission line 174 can also directly transmit the signal to the first circuit board 110c. Therefore, the number of contacts between the first circuit board 110c and the second circuit board 130c is reduced and the requirement for alignment accuracy is reduced. Moreover, compared with the electronic device 100b, since the first circuit board 110c of the present embodiment does not have the first groove hole 116, the first circuit board 110c has a larger area. In addition, since the first groove hole 116 and the second groove hole 137 do not need to be aligned, the manufacturing process is easier.

In summary, in the electronic device of the disclosure, the sensing element is disposed on the first surface of the first circuit board, and the second circuit board is located on the second surface of the first circuit board. With the laminated structure of the circuit board, the circuit board does not need to be bent. Therefore, the electronic device of the disclosure can prevent the supporting holder where when the conventional flexible circuit board is adopted, the flexible circuit board is bent and needs to be supported by the supporting holder, which occupies a larger space. Therefore, the circuit components of the electronic device of the disclosure may occupy a smaller space. In addition, the electronic element is disposed on the second surface of the first circuit board and is located in the groove of the second circuit board. The second circuit board can accommodate the electronic element by the groove to be connected to the first circuit board, so the thickness of the laminated structure of the two circuit boards can be effectively reduced. In addition, the light emitting element is disposed at least on the first side surface of the first circuit board. In this way, the space of the side surface of the circuit board can be effectively used to prevent the light emitting element from additionally occupying the space above and below the circuit board to reduce the area of the circuit board, thereby reducing the size of the electronic device.

What is claimed is:

1. An electronic device, comprising:
   a first circuit board, having a first surface and a second surface opposite to each other and a first side surface located between the first surface and the second surface;
   a sensing element, disposed on the first surface of the first circuit board and electrically connected to the first circuit board;
   a second circuit board, located on the second surface of the first circuit board and electrically connected to the first circuit board, wherein the second circuit board has a third surface facing the first circuit board and a groove recessed in the third surface;
   an electronic element, disposed on the second surface of the first circuit board and located in the groove;
   a light emitting element, disposed at least on the first side surface of the first circuit board, wherein the light emitting element has two pads, one of the two pads is connected to the first side surface of the first circuit board, and the other of the two pads is connected to a second side surface of the second circuit board; and
   a lens, disposed on the sensing element.

2. The electronic device according to claim 1, wherein the first circuit board has a first long side, the electronic element has a second long side, the first long side is parallel to the second long side, and the groove extends along an extending direction of the first long side.

3. The electronic device according to claim 1, wherein the first circuit board has a first long side, the electronic element has a second long side, the first long side is perpendicular to the second long side, and the groove extends along an extending direction of the second long side.

4. The electronic device according to claim 1, wherein the electronic device further comprises a plurality of transmission lines, the second circuit board has a fourth surface opposite to the third surface and a plurality of blind holes recessed in the fourth surface, and the transmission lines are respectively inserted into the blind holes to be electrically connected to the second circuit board.

5. The electronic device according to claim 1, wherein the electronic device further comprises a coaxial transmission line, the first circuit board has a third side surface adjacent to the first side surface and a first groove hole recessed in the third side surface, the second circuit board has a fourth side surface adjacent to the second side surface and a second groove hole recessed in the fourth side surface, the second groove hole corresponds to the first groove hole, the coaxial transmission line is located in the first groove hole and the second groove hole, an outer layer route of the coaxial transmission line is connected to the second circuit board, and an inner layer route of the coaxial transmission line is connected to the first circuit board.

6. The electronic device according to claim 5, wherein the second circuit board has a fourth surface opposite to the third surface and a blind hole recessed in the fourth surface, and the electronic device further comprises a transmission line inserted into the blind hole to be electrically connected to the second circuit board.

7. The electronic device according to claim 1, wherein the electronic device further comprises a coaxial transmission line, the second circuit board has a fourth side surface adjacent to the second side surface and a second groove hole recessed in the fourth side surface, the coaxial transmission line is located in the second groove hole, an outer layer route of the coaxial transmission line is connected to the second circuit board, and an inner layer route of the coaxial transmission line is connected to the second surface of the first circuit board.

8. The electronic device according to claim 7, wherein the second circuit board has a fourth surface opposite to the third surface and a blind hole recessed in the fourth surface, and the electronic device further comprises a transmission line inserted into the blind hole to be electrically connected to the second circuit board.

9. An electronic system, comprising:
   an electronic device, comprising:
      a first circuit board, having a first surface and a second surface opposite to each other and a first side surface located between the first surface and the second surface;
      a sensing element, disposed on the first surface of the first circuit board and electrically connected to the first circuit board;
      a second circuit board, located on the second surface of the first circuit board and electrically connected to the first circuit board, wherein the second circuit board has a third surface facing the first circuit board and a groove recessed in the third surface;
      an electronic element, disposed on the second surface of the first circuit board and located in the groove;
      a light emitting element, disposed at least on the first side surface of the first circuit board, wherein the light emitting element has two pads, one of the two pads is connected to the first side surface of the first circuit board, and the other of the two pads is connected to a second side surface of the second circuit board; and
      a lens, disposed on the sensing element; and
   a processor, electrically connected to the electronic device, wherein the sensing element receives an image transmitted by the lens, and the processor processes the image received by the sensing element.

10. The electronic system according to claim 9, wherein the first circuit board has a first long side, the electronic element has a second long side, the first long side is parallel to the second long side, and the groove extends along an extending direction of the first long side.

11. The electronic system according to claim 9, wherein the first circuit board has a first long side, the electronic element has a second long side, the first long side is perpendicular to the second long side, and the groove extends along an extending direction of the second long side.

12. The electronic system according to claim 9, wherein the electronic device further comprises a plurality of transmission lines, the second circuit board has a fourth surface opposite to the third surface and a plurality of blind holes recessed in the fourth surface, and the transmission lines are respectively inserted into the blind holes to be electrically connected to the second circuit board.

13. The electronic system according to claim 9, wherein the electronic device further comprises a coaxial transmission line, the first circuit board has a third side surface adjacent to the first side surface and a first groove hole recessed in the third side surface, the second circuit board has a fourth side surface adjacent to the second side surface and a second groove hole recessed in the fourth side surface, the second groove hole corresponds to the first groove hole, the coaxial transmission line is located in the first groove hole and the second groove hole, an outer layer route of the coaxial transmission line is connected to the second circuit board, and an inner layer route of the coaxial transmission line is connected to the first circuit board.

14. The electronic system according to claim 13, wherein the second circuit board has a fourth surface opposite to the third surface and a blind hole recessed in the fourth surface, and the electronic device further comprises a transmission line inserted into the blind hole to be electrically connected to the second circuit board.

15. The electronic system according to claim 9, wherein the electronic device further comprises a coaxial transmission line, the second circuit board has a fourth side surface adjacent to the second side surface and a second groove hole recessed in the fourth side surface, the coaxial transmission line is located in the second groove hole, an outer layer route of the coaxial transmission line is connected to the second circuit board, and an inner layer route of the coaxial transmission line is connected to the second surface of the first circuit board.

16. The electronic system according to claim 15, wherein the second circuit board has a fourth surface opposite to the third surface and a blind hole recessed in the fourth surface, and the electronic device further comprises a transmission line inserted into the blind hole to be electrically connected to the second circuit board.

\* \* \* \* \*